(12) United States Patent
Mackh et al.

(10) Patent No.: US 12,374,632 B2
(45) Date of Patent: Jul. 29, 2025

(54) SEMICONDUCTOR DEVICE AND METHOD FOR MANUFACTURING A PLURALITY OF SEMICONDUCTIVE DEVICES

(71) Applicant: Infineon Technologies AG, Neubiberg (DE)

(72) Inventors: Gunther Mackh, Neumarkt (DE); Martin Brandl, Brennberg (DE); Bernhard Drummer, Lappersdorf (DE)

(73) Assignee: Infineon Technologies AG, Neubiberg (DE)

( * ) Notice: Subject to any disclaimer, the term of this patent is extended or adjusted under 35 U.S.C. 154(b) by 206 days.

(21) Appl. No.: 18/047,467

(22) Filed: Oct. 18, 2022

(65) Prior Publication Data
US 2023/0130979 A1    Apr. 27, 2023

(30) Foreign Application Priority Data

Oct. 22, 2021   (EP) ..................................... 21204133

(51) Int. Cl.
*H01L 23/00*       (2006.01)
*H01L 21/78*       (2006.01)

(52) U.S. Cl.
CPC ............ *H01L 23/562* (2013.01); *H01L 21/78* (2013.01)

(58) Field of Classification Search
CPC .............................. H01L 23/562; H01L 21/78
See application file for complete search history.

(56) References Cited

U.S. PATENT DOCUMENTS

2004/0036173 A1    2/2004  Rodgers
2008/0248613 A1*  10/2008  Chen ................... G02B 26/0833
                                                    438/115

FOREIGN PATENT DOCUMENTS

WO    2013097135 A1    7/2013
WO    2017105851 A1    6/2017
WO    2018148871 A1    8/2018

* cited by examiner

*Primary Examiner* — Zandra V Smith
*Assistant Examiner* — Molly K Reida
(74) *Attorney, Agent, or Firm* — Slater Matsil, LLP

(57) ABSTRACT

A semiconductor device includes an active region and a trapping region positioned peripherally with respect to the active region, the trapping region presenting trapping apertures permitting the passage of particles, the trapping apertures being in fluid communication with at least one trapping chamber for trapping the particles. A method for manufacturing the semiconductor devices from one semiconductor wafer presents semiconductor device regions to be singulated along a dicing portion line. The method includes in each semiconductor device region, making a semiconductor device precursor by making or applying at least one active element in an active region, making at least one trapping chamber and making, in a trapping region of the semiconductor device region positioned more peripherally than the active region, trapping apertures in fluid communication with the at least one trapping chamber; and singulating the semiconductor device regions by separating the semiconductor device precursors along the dicing portion lines.

20 Claims, 9 Drawing Sheets

SEMICONDUCTOR DEVICE AND METHOD FOR MANUFACTURING A PLURALITY OF SEMICONDUCTIVE DEVICES

This application claims the benefit of European Patent Application No. 21204133, filed on Oct. 22, 2021, which application is hereby incorporated herein by reference.

TECHNICAL FIELD

The present invention relates to a semiconductive device (e.g., a chip-like semiconductor device) and a method for manufacturing a plurality of semiconductive devices.

BACKGROUND

The constant miniaturization of semiconductor devices (e.g., micro electrical mechanic systems, MEMS) causes their continuous reductions of their dimensions over the years. Extremely miniaturized systems, however, are sensitive to powders, which may greatly reduce their performances. If powder is deposited on the membrane of a MEMS microphone, for example, an undetermined reduction of its performance is caused. This in particular occurs in particularly large devices (e.g., membranes . . . ), where an accumulation of powder in a particular area is particularly undesired.

The problem is exacerbated by the fact that some semiconductor devices are manufactured using methods which cause the generation of powder. It has been noted by the inventors, for example, that when singulating a semiconductor wafer by cracking the wafer by a laser beam, not only powder is generated immediately, but also some structures (so-called candle sticks) are generated, which break only subsequently, generating powder at undetermined time instants, even when the semiconductor device is sold and in operation. Hence, powder is intrinsically generated by the semiconductor device itself in those situations. This is in particular undesired, since the powder tends to accumulate in the peripheral regions of the active area of the semiconductor device, hence reducing the performances of the semiconductor device in operation.

Therefore, it is required some solutions for avoiding that powder arrives onto an active area of a semiconductor device at an undetermined time instant.

SUMMARY

According to an aspect, there is provided a semiconductor device comprising:
  an active region; and
  a trapping region positioned peripherally with respect to the active region, the trapping region presenting at least one trapping aperture permitting the passage of particles, the at least one trapping aperture being in fluid communication with at least one trapping chamber for trapping the particles.

Accordingly, the trapping region may receive the particles, hence avoiding that the particles arrive at the active region.

According to an aspect, at least one trapping aperture has a tapered shape gradually ex-tending from a first trapping aperture portion toward a second trapping aperture portion broader than the first trapping aperture portion. According to an aspect, the at least one trapping aperture is delimited by at least one couple of borders gradually divaricating from the first trapping aperture portion toward the second trapping aperture portion, so as to guide a particle from the first trapping aperture portion toward the second trapping aperture portion.

Accordingly, a particle may be subjected to a force towards the second trapping aperture portion by effect of its own weight, e.g. by virtue of its barycenter being spaced from sup-porting points on which the particle is supported, which implies a momentum on the particle, which therefore tends to move (e.g., by rolling) towards the second trapping aperture portion.

Moreover, a piggybank effect is achieved, since the particles entering in the trapping chamber through the second trapping aperture portion will have an extremely low probability of exiting from the trapping chamber, since most of the positions within the trapping chamber are either not below an aperture or below a portion of the aperture which is so narrow that doesn't let the particle to exit.

According to an aspect, the at least one couple of borders includes at least one first couple of borders and at least one second couple of borders. The at least one first couple of borders may be closer to the at least one trapping chamber than the at least one second couple of borders, and the at least one first couple of borders may restrict the at least one trapping aperture with respect to the second couple of borders.

Accordingly, the second couple of borders may keep the particle in position even in the case of the particle being subjected to a force toward a lateral direction. The particle may bounce on the border of the second couple of borders, thereby going back to its position on the first couple of borders.

According to an aspect, the most proximal part of the second trapping aperture portion is linked to a lateral trapping aperture portion which increases the elongation of at least one trapping aperture along a peripheral direction. In addition or alternative, the at least one trapping aperture further presents a third trapping aperture portion more proximal than the second trapping aperture portion and which increases the elongation of the least one trap-ping aperture along a distal/proximal direction.

Accordingly, at least one trapping aperture may result elongated, and therefore permit to trap elongated particles.

According to an aspect, there is provided a method for manufacturing a plurality of semi-conductor devices (e.g., like one of those above and/or below) from one semiconductor wafer presenting a plurality of semiconductor device regions to be singulated along dicing portion lines, the method including:
  in each semiconductor device region, making a semiconductor device precursor by making or applying at least one active element in an active region, making at least one trapping chamber and making, in a trapping region of the semiconductor device region positioned more peripherally than the active region, at least one trapping aperture in fluid communication with the at least one trapping chamber; and
  singulating the semiconductor device regions by separating the semiconductor device precursors along the dicing portion lines, thereby obtaining the plurality of semiconductor devices.

Accordingly, it is possible to obtain a plurality of semiconductor devices which tolerate the presence of powder (both the powder generated by singulating the wafer and other powder which risks to arrive to the active regions of the semiconductor devices.

The method may include shaping at least one trapping aperture according to a tapered shape which gradually extends from a first trapping aperture portion toward a second trapping aperture portion broader than the first trapping aperture portion. Additionally or in alternative, shaping may include shaping the at least one trapping aperture so that the second trapping aperture portion permits the passage of a determined particle with a determined diameter, and the first trapping aperture portion does not permit the passage of the determined particle.

Accordingly, powder generated during the manufacturing process may be trapped in the at least one trapping chamber, and/or also additional powder moving toward the active areas of the semiconductor devices may be trapped thereinto.

According to an aspect, the method may comprise causing the semiconductor wafer to adhere to an adhesive layer, wherein singulating includes:

generating cracks (e.g., by laser) along the dicing portion lines, so that the semiconductor device precursors become semiconductor devices separated from each other; and, subsequently, causing the adhesive layer to expand, thereby spacing the semiconductor devices from each other.

These steps (or any other singulation steps) may be performed reliably, because the generated powder will fall in the at least one trapping chamber.

BRIEF DESCRIPTION OF THE DRAWINGS

FIG. 1b shows an enlarged view of the semiconductor device of FIG. 1a;

FIG. 2b shows an enlarged view of the semiconductor wafer of FIG. 2a;

DETAILED DESCRIPTION OF ILLUSTRATIVE EMBODIMENTS

Figure 1A:
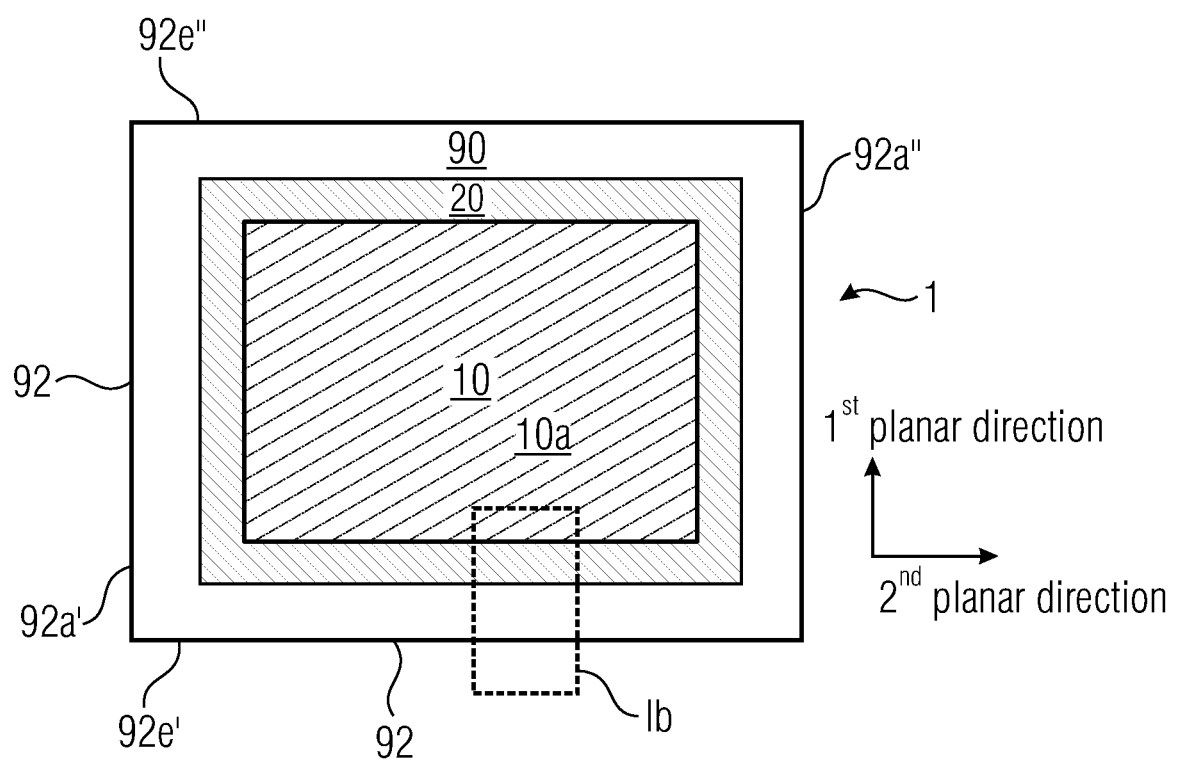
FIG. 1a show a planar view of a semiconductor device according to an example.
Figure 1B:
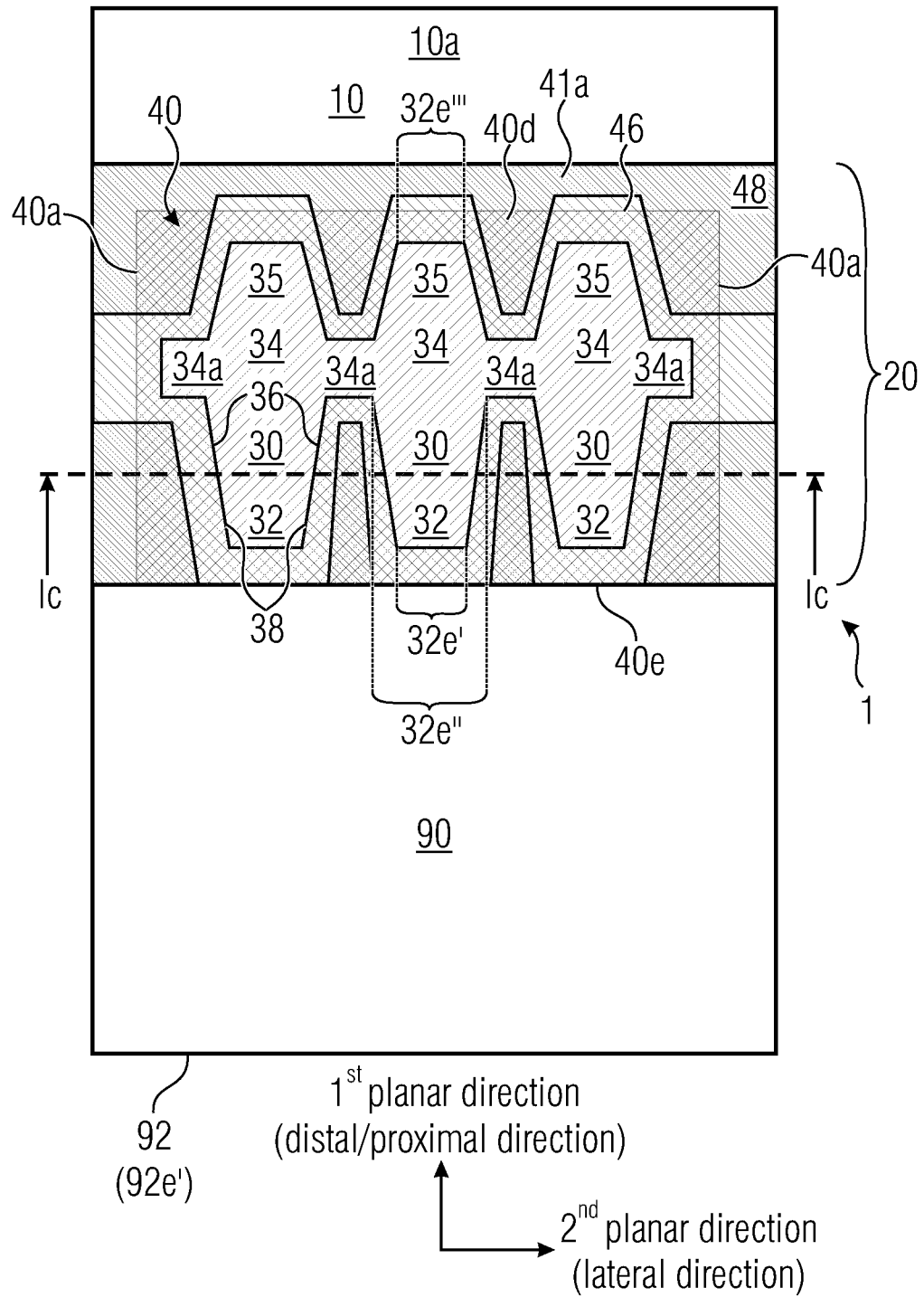
Figure 1C:
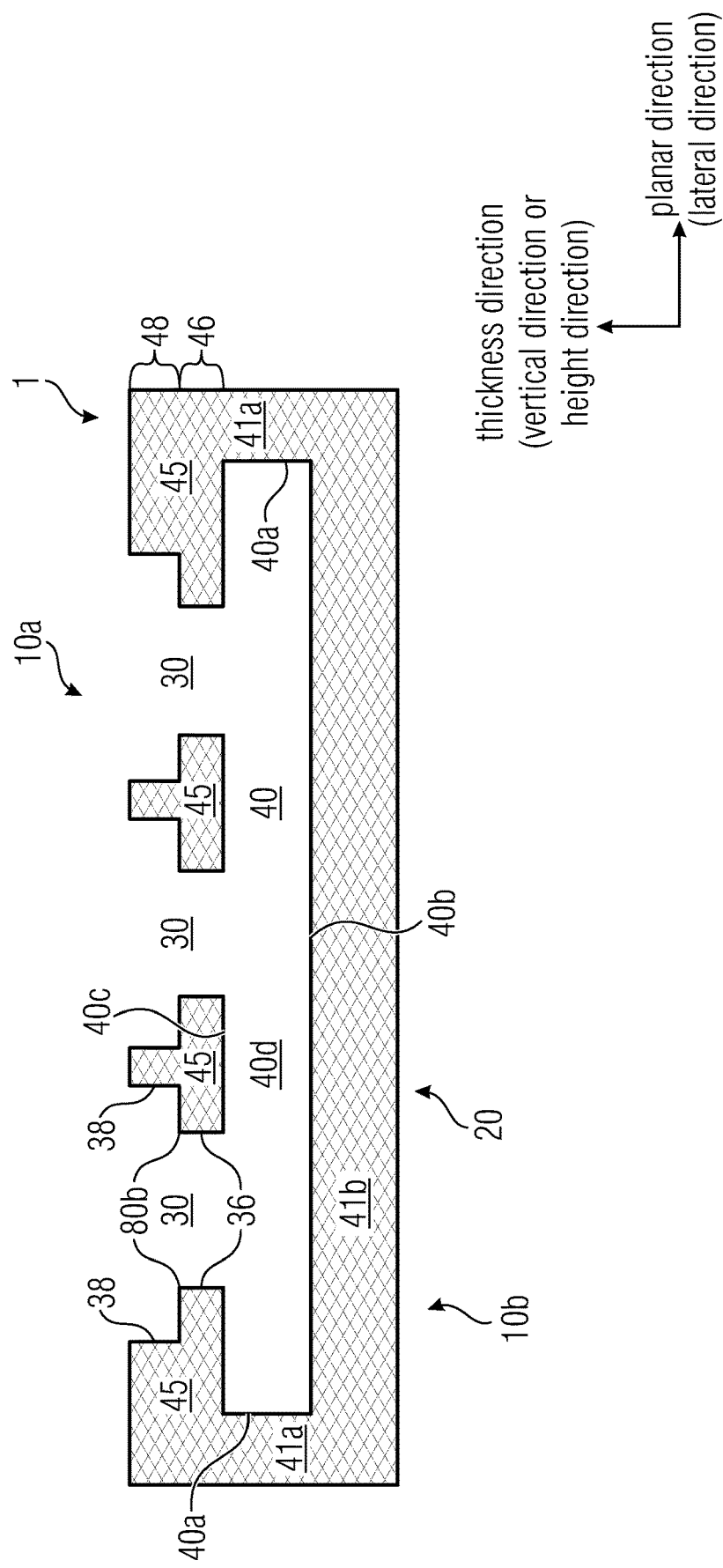
FIG. 1c shows a view of the semiconductor device of FIGS. 1a and 1b along a sectional line shown in FIG. 1b.

FIGS. 1a-1c show a semiconductor device 1 according to an example. The semiconductor device 1 may be a chip. FIG. 1a shows an example from above, and shows the semiconductor device 1 as extending along two planar directions. In particular, FIG. 1a shows a first planar direction which is represented as vertical in FIG. 1a and a second planar direction, which is represented as horizontal in FIG. 1a. In FIG. 1a, the first planar direction may extend along (e.g., in parallel to) two sides 92a' and 92a" to intersect (e.g., perpendicularly) two sides 92e' and 92e", and the second planar direction may extend along (e.g., in parallel to) two sides 92e' and 92e" to intersect (e.g., perpendicularly) the two sides 92a' and 92a". In particular, this applies when the semiconductor device 1 has a rectangular (e.g., square) shape. FIG. 1a shows a top face 10a extending substantially along the planar directions. A reversed face 10b (bottom face) may also extend substantially along the planar directions, even though on the other side of the semiconductor device 1. A thickness direction (perpendicular to the paper in FIG. 1a) intersecting (e.g., perpendicularly) the top face 10a and the bottom face 10b cannot be seen in FIG. 1a. The thickness direction is here also called height direction and is also often considered to be the vertical direction, since most of the a use of the semiconductor device 1, for the purpose of the embodiments described herein, is often intended in such a way that the faces 10a and 10b are meant to be placed horizontally (or substantially horizontally) with face 10 being over face 10b, and the thickness direction of the semiconductor device 1 is meant to be vertical (altimetrically, geodetically vertical), to permit gravity to exert its action along the vertical direction. Of course, in case the semiconductor device 1 is oriented differently, the thickness direction and the vertical direction do not coincide anymore (e.g., they diverge). The semiconductor device 1 may include at least one trapping aperture 30. In this case, the semiconductor device 1 may include a plurality of trapping apertures 30. The at least one trapping aperture 30 may guide particles along borders 36 (e.g., by rolling) and letting the particles enter (e.g., fall) onto at least one trapping chamber 40 through the at least one trapping aperture 30, e.g. by gravity, which is facilitated when the top face 10a (which defines the aperture(s) 30) is placed over the bottom face. In many applications the extension (thickness) of the semiconductor device 1 along the thickness direction (height direction, vertical direction) is much smaller than the extension of the semiconductor device 1 along the first and/or second planar directions (e.g., the thickness may be much smaller than each of the sides 92a', 92a, 92e', and 92e", e.g. at least ten times smaller). It will be shown that FIG. 1b shows enlarged portion of FIG. 1a in correspondence of area Ib of FIG. 1a. Here below accent is more given to a "distal/proximal direction" and a "lateral or peripheral direction". The "distal/proximal direction" may be seen as a direction between the center of the semiconductor device 1 and the border 92 (e.g., the border 92 encompassing the sides 92a', 92a, 92e', and 92e") of the of the semiconductor device 1 (in particular, reference is made to "towards the proximal direction" when a movement is from the periphery towards the center of the semiconductor device 1; and "towards the distal direction" when a movement is from the center towards the periphery of the semiconductor device 1). The "lateral or peripheral direction" is along one of the sides 92a', 92a, 92e', and 92e"). Therefore, the "first planar direction" (vertical in FIGS. 1a and 1b) is, in FIG. 1b, also the "distal/proximal direction", and the "second planar direction" (horizontal in FIGS. 1a and 1b) is, in FIG. 1b, also the "lateral or peripheral direction", but this is valid in the regions having (adjacent to) the sides 92e' and 92e". In the regions having the sides 92a' and 92a", the "second planar direction" (vertical in FIG. 1a) becomes the "distal/proximal direction", and the "first planar direction" (horizontal in FIG. 1a) becomes the "lateral or peripheral direction". Therefore, for a region of the semiconductor device 1 having one of the sides 92a', 92a, 92e', and 92e", the "lateral or peripheral direction" may be the direction (e.g., among the planar directions) parallel to the one of the sides 92a', 92a, 92e', and 92e", and the "distal/proximal direction" may be the direction (e.g., among the planar directions) which varies together with the distance to the center (e.g., the "lateral or peripheral direction" may be the direction perpendicular to the one of the sides 92a', 92a, 92e', and 92e"). In general terms, it may be imagined that the sides 92a', 92a, 92e', and 92e" correspond to dicing portion lines 92 along which the semiconductor device 1 has been cut starting from a semiconductor wafer (see also below).

FIG. 1a shows an active region 10, a trapping region 20, positioned peripherally (at least in the planar directions) with respect to the active region 10. The active region 10 and the trapping region 20 may be made integral in one single piece (e.g., obtained from one single semiconductor block) or at least one portion of the active region 10 being made integral in one single piece with the trapping region 20. The trapping region 20 may directly delimit the active region 10, e.g. at least in the planar directions, e.g. when seen from above (e.g., from the top face 10a). Around the trapping region 20 (e.g., at least in the planar directions, e.g. when seen from above), a most external region 90 may be present (although not always strictly necessary). The most external region 90 and the trapping region 20 may be made integral in one single piece (e.g., obtained from one single semiconductor block) with the trapping region 20. The most external region 90 may directly delimit the trapping region 20, e.g. at least in the planar directions, e.g. when seen from above (e.g., from the top face 10a). Hence, the active region 10 may be adjacent to the trapping region 20, and/or the trapping region 20 may be adjacent to the external region 90. In examples, when seen from above (in the thickness direction), the active region 10 may be completely surrounded by the trapping region 20, and/or the trapping region 20 may be completely surrounded by the external region 90. Notably, the sides 92a', 92a, 92e', and 92e" may be in the most external region 90. Therefore, in some examples, the active region 10 may be peripherally (partially or totally) surrounded by the trapping region 20. The active region 10 may be peripherally (partially or totally) surrounded by the trapping region 20. The trapping region 20 and the most external region 90 may be more external with respect to the active region 10 and may in general not be active regions (for example, they are not doped). The active region 10 may contain or support or anyhow be constituted by any possible active semiconductor element. The active region 10 may include or support, for example, at least one diode (e.g., photodiode), or at least another semiconductive element having a junction P-N; at least one transistor (e.g., phototransistor), or at least another semiconductor element, e.g. having a junction P-N-P or N-P-N; at least one micromechanical electrical system, MEMS; at least one acoustic sensor such as a microphone or another type of capacitor; at least one sensor of another kind; at least one lens; and any other possible circuitry constituted in, or supported by, the active region 10. It is here not always specifically important which is the active semiconductive element implemented in the active region 10. In examples, while the most external region 90 may be bulk and/or massive, the trapping region 20 may comprise holes (trapping aperture(s) and/or at least one trapping chamber, see below).

The semiconductor device 1 may include at least one internal trapping chamber 40 (not shown in FIG. 1a) and trapping aperture(s) 30 (also not shown in FIG. 1a). The trapping aperture(s) 30 may be in the trapping region 20, and may permit the fluid communication of the at least one trapping chamber 40 (e.g., from above) with the external environment. At least one of the trapping aperture(s) 30 is positioned so that, when seen from above, at least one portion of the floor 40b of the at least one trapping chamber 40 can be seen (or, said in another way, the projection of at least one trapping aperture 30 towards the distal direction intersects the floor 40b of the trapping chamber 40).

FIG. 1b shows an enlarged image of the portion 1b shown in FIG. 1a. In FIG. 1b (which also images the area in the planar directions), both the active region 10, the trapping region 20, and the most external region 90 are shown. In FIG. 1b, it is possible to see the trapping aperture(s) 30, which make the internal trapping chamber 40 to communicate with the external environment. As can be seen in FIG. 1b, multiple aperture(s) 30 (which may be in communication with each other, e.g. along the lateral or peripheral direction) may communicate with one single trapping chamber 40 (in some examples, notwithstanding, there may be multiple trapping chambers 40, each of which may communication with at least one or a plurality of trapping aperture(s) 30).

As can be seen in FIG. 1b, the extension of the trapping chamber 40 may be greater than the extension of the trapping aperture(s) 30 (in particular, the trapping chamber 40 may have a surficial extension, along the planar directions, broader, e.g. at least 50% broader, than the sum of the surficial extensions of all the trapping aperture(s) 30 communicating with the respective trapping chamber 40).

As can be seen from FIG. 1b, each trapping aperture 30 may have a tapered shape. The tapered shape may gradually extend from a first trapping aperture portion 32 towards a second trapping aperture portion 34, which is broader than the first trapping aperture portion 32. Therefore, the more distal trapping aperture portion (which is the first trapping aperture portion 32) is narrower than a more proximal trapping aperture portion (which is the second trapping aperture portion 34). In particular, a distance 32e' (measured along the lateral or peripheral direction and taken at the most distal edge of the aperture 30) between two borders 36 (or 38) of the first trapping aperture portion 32 is smaller than a distance 32e" (measured along the lateral or peripheral direction) between the same two borders 36 (or 38) (taken at the same height measured along the thickness direction) and measured at the second trapping aperture portion 34. Each trapping aperture 30 may be seen as being delimited by at least one couple or borders (e.g., 36 and/or 38). The at least one couple of borders (e.g., 36 or 38) may gradually divaricate (e.g., as seen in the planar direction) from the first trapping aperture portion 32 toward the second trapping aperture portion 34. As can be appreciated from FIG. 1b, by virtue of the trapping aperture(s) 30, there is the possibility that a spherical element (e.g., a particle, such as a powder particle), positioned on the face 10a in correspondence of the first trapping aperture portion 32, cannot enter into the chamber 40 from above, but the same particle can enter (e.g., by at least gravity or at least another other biasing force) into the trapping chamber 40 in correspondence of the second trapping aperture portion 34.

FIG. 1c is a cross sectional view taken along the lines Ic-Ic in FIG. 1b. FIG. 1c shows the extension in the thickness direction (which is vertical in FIG. 1c) and a lateral or peripheral direction (which is horizontal in FIG. 1c and which corresponds to the first planar direction horizontal in FIGS. 1a and 1b). FIG. 1c shows that the trapping chamber 40 is internally delimited by at least one of:
  two lateral walls 40a (delimiting the trapping chamber 40 in the lateral or peripheral direction);
  a distal wall 40e and a proximal wall 40d (both delimiting the trapping chamber 40 in the distal/proximal direction);
  a ceiling 40b (delimiting the trapping chamber 40 in the thickness direction, at the side of the top face 10a);
  a floor 40c (delimiting the trapping chamber 40 in the thickness direction, at the side of the bottom face 10b).

The two walls 40a are here considered as lateral walls, while the proximal wall 40d is also present (and it is the wall seen as parallel to the plane of the paper in FIG. 1c) and the distal wall 40e which is not seen in FIG. 1c (but is indicated in FIG. 1b and, in this case, may be delimited by a wall separating the external region 90 from the trapping region 20). Therefore, the walls 40a, 40d and 40e are substantially parallel to the thickness direction and the ceiling 40c and the floor 40b are substantially parallel to the plane formed by the planar directions.

Each trapping aperture 30 is here represented as having a first couple of borders 36 and a second couple of borders 38, which is the first couple of borders 36 intermediate between the trapping chamber 40 and the second couple of borders 38. As can be seen from both FIGS. 1b and 1c, the extension (in particular along the lateral or peripheral direction and/or the distal/proximal direction) of the second, higher couple of borders 38 is broader than the extension of the first, lower couple of borders 36. The first couple of borders 36 restricts the trapping aperture with respect to the second couple of borders 38 as seen from above, so that the surficial extension of the trapping aperture 30 along the second couple of borders 38 is greater than the surficial extension of the trapping aperture 30 along the first couple of borders 36. This means, for example, that in correspondence to the position of FIG. 1c, a spherical particle having a diameter shorter than the distance (measured along the lateral or peripheral direction) between the borders 36 can enter into the trapping chamber 40, but a spherical particle having a diameter larger than the distance (measured along the lateral or peripheral direction) between the borders 36 cannot enter into the trapping chamber despite being smaller than the distance between the borders 38.

In general terms, the trapping chamber 40 may be obtained between:
   an extending layer 41b (which may internally delimit the floor 40b and/or externally delimit the bottom face 10b), e.g. extending along the planar directions;
   two vertically extending layers 41a (which may internally delimit the lateral walls 40a);
   a top layer 45 (which may internally delimit the ceiling 40c and/or externally delimit the top face 10a) which is, notwithstanding, open in correspondence to the aperture 30 (e.g. the borders 36 and/or 38 being obtained in the top layer 45), the top layer 45 being, in examples, constituted by two or at least two sublayers 46 and 48:
      a first sublayer 46 may be considered to delimit the shape of the first couple of borders 36 (e.g., as seen from above),
      while the second, higher sublayer 48 may be considered to delimit the shape of the second couple of borders 38 (e.g., as seen from above).

Basically, in some examples the trapping chamber 40 may be considered to be delimited by the layers 41a, 41b, 45 (46, 48) and also by the external region 90 (which generates the wall 40e) and by another massive region 41a (which can only be seen in FIG. 1b), which delimits the wall 40d, and by the trapping aperture(s) 30. In other examples, however, a different shape of the at least one trapping chamber 40 may be defined. In some examples, adjacently to one of the layers 41a and 41b, another trapping chamber 40 may be present, opened to the external environment through other trapping aperture(s) 30.

As shown in FIG. 1b, each trapping aperture 30 may have a third, proximal aperture portion 35 which, in some examples, is optional. A distance 32e''' (measured along the lateral or peripheral direction) between two borders 36 (or 38) of the third trapping aperture portion 35 may be smaller than the distance 32e'' (measured along the lateral or peripheral direction, at the same height) between the same two borders 36 (or 38). In some cases, also the portion 35 may be made symmetrically (or almost symmetrical) to the first trapping aperture portion 32, and in particular, be defined by borders which are tapered, even though in this case, the borders divaricate towards the distal direction.

When seen in the planar direction (e.g., from above), the trapping aperture(s) 30 may be linked with each other through lateral portions 34a, which are also opened on the at least one trapping chamber 40. Notwithstanding, the lateral portions 34a may be avoided. In any case, the lateral portions 34a may help in permitting the passage of particles through the aperture 30 when the particles have a shape which is prolonged (e.g., elliptical). The same may apply to the third aperture portion 35, which may therefore permit entrance of elliptical or elongated particles. Therefore, in some examples, at least one trapping aperture 30 may have a shape which is more elongated and is prolonged, in a proximal direction, also towards the second trapping aperture portion 36 (each constituting a third trapping aperture portion 35) which may have a narrower extension (e.g., in the lateral or peripheral direction) than the maximal lateral extension of the second trapping aperture portion 34. In addition or in alternative, the at least one trapping aperture 30 may include at least one lateral portion 34a (e.g., lateral when seen from above), which extends more laterally with respect to the second trapping aperture portion 34, thereby increasing the lateral extension of the trapping aperture 30 and, consequently, the diameter of the particles that can be inserted into the trapping chamber 40. The two lateral portions 34a (laterally linked to the second trapping aperture portion 34) may therefore cause the most proximal part of the second trapping aperture portion 34 to result substantially borderless, thereby greatly increasing the diameter of the particle that can enter into the trapping chamber 40.

Therefore, each trapping aperture 30 may extend along two preferential directions, due to the sequence of portions 32/34/35 (extending in the distal/proximal direction from the more distal part, closer to the external region 90, towards the most proximal part, closer to the active region 10) and/or 34a/34/34a (extending along the lateral or peripheral direction).

In examples in which there are two different couples of borders 36 and 38, the shape of the trapping aperture 30 (and in particular, of the portions 32, 35, 36, 34a) may be understood at least as the shape of the narrower couple of borders (e.g., the first couple of borders 36), because that shape is the shape that permits or does not permit a particle to fall in the trapping chamber 40.

By virtue of the particular shapes of the trapping aperture(s) 30 in respect to the at least one trapping chamber 40, it can be understood that a spherical particle of a determined diameter can, for example, enter (e.g., fall, by gravity) into the chamber 40 through the second trapping aperture portion 34 but, once inside the trapping chamber 40, the spherical particle has only one possibility for exiting from the trapping chamber 40 (i.e., through the second trapping aperture portion 34). When inserted into the trapping chamber 40, the particle may move (in the planar direction inside the trapping chamber 40, but can only exit through the second trapping aperture portion 34). If, by moving inside the trapping chamber 40, the spherical particle ends to be in correspondence of the portions 32 or (if present 35 and/or 34a or under the ceiling 40c) then the spherical particle cannot exit anymore.

In the case of elongated (e.g., elliptical, oval) particles, an elongated particle can enter the trapping aperture 30 along one of the two preferential directions (e.g., one along the distal/proximal direction having the succession of portions 32/34/35, or the lateral or peripheral direction having the succession of portions 34a/34/34a) but, as long as the elongated particle moves within the trapping chamber 40 or otherwise changes the orientation in the trapping chamber 40, the elongated particle cannot exit from the trapping chamber 40 anymore.

In general terms, a piggybank effect is obtained, which highly reduces the probability, for a spherical or elongated particle trapped in the trapping chamber 40, to go back in the external environment.

In particular, it may be provided that the extension of the trapping aperture(s) 30 is so that, while a particle having determined diameter can pass through the trapping aperture(s) 30 (e.g., in correspondence of the second trapping aperture portion 34), two particles tangent to each other, each particle having the same determined diameter, cannot pass through one of the aperture(s) 30, thereby minimizing the probability of particles exiting from the at least one trapping chamber 40. For example, neither the of the portions 35 and 34a alone permits the passage of one single spherical particle of the determined diameter, while each second trapping aperture portion 34 permits the passage of only one particle at time. Therefore, in the example of FIG. 1b, only three particles (one for each trapping aperture 30) may simultaneously escape from the trapping chamber 40 at each time.

Figure 3A:
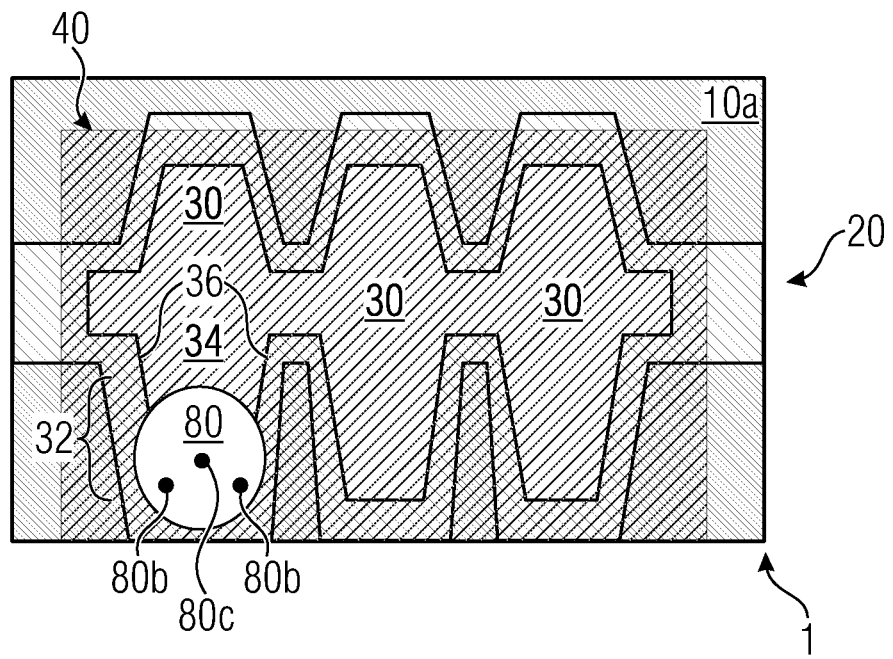
FIGS. 3a-3d show a temporal sequence of operation of an embodiment of the invention.
Figure 3B:
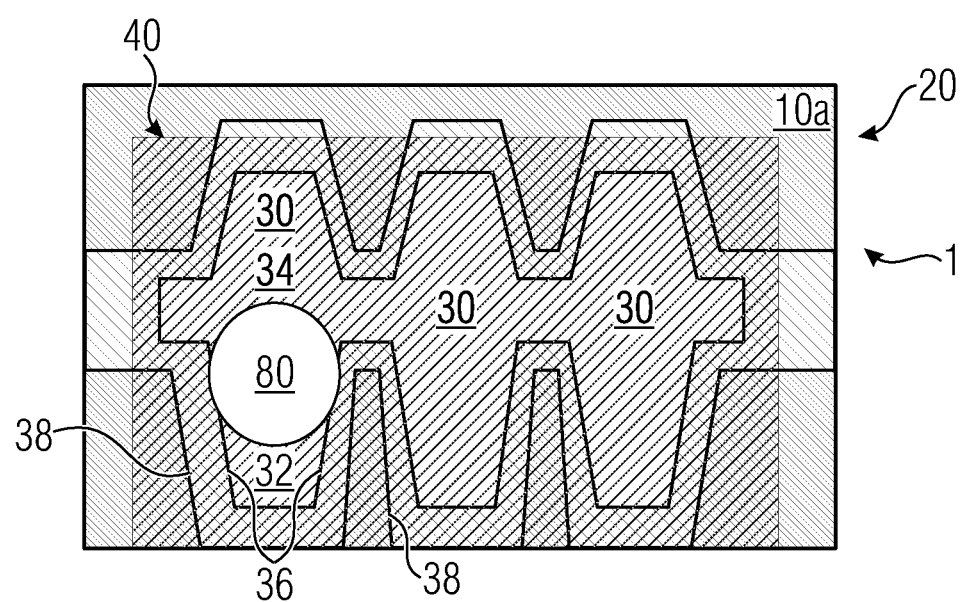
Figure 3C:
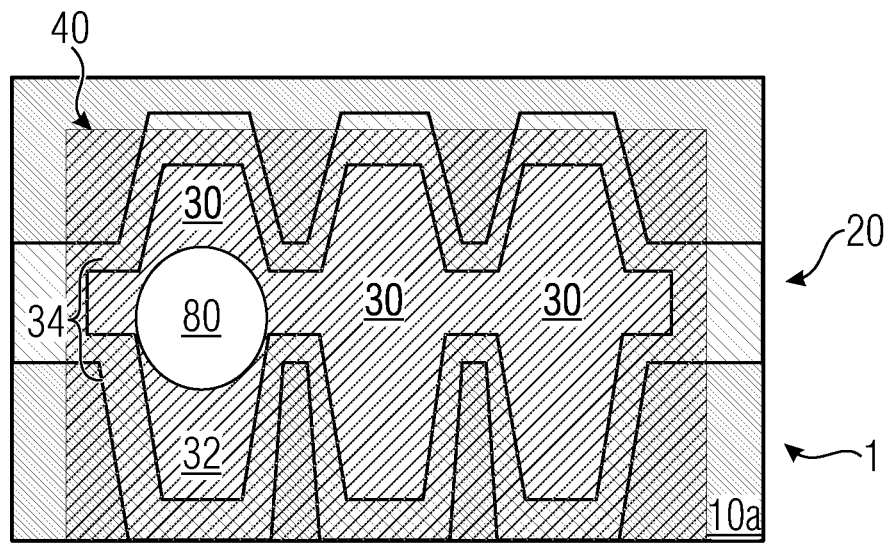
Figure 3D:
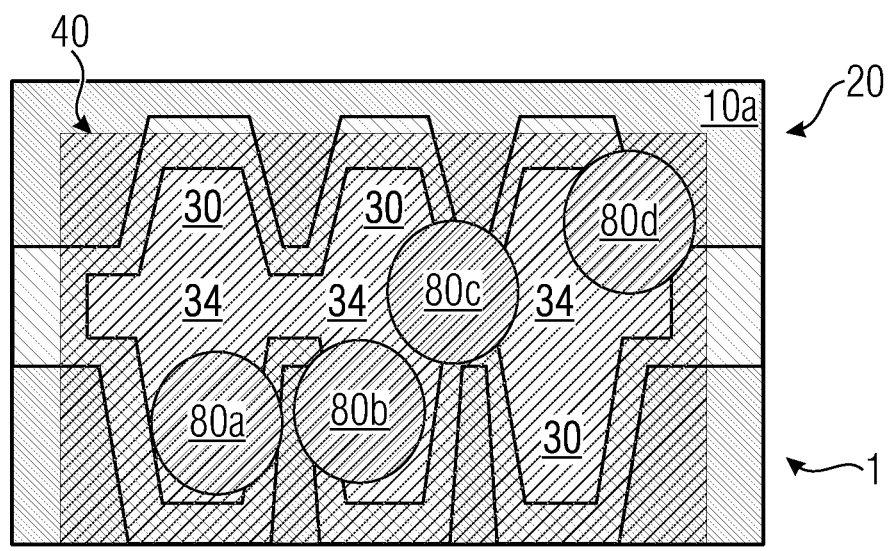

FIGS. 3a-3d show a sequence of a spherical powder particle 80 initially moving along the surface of the semiconductor device 1 (e.g., on the top face ma), in correspondence to the trapping region 20. As can be seen in FIG. 3a, the particle 80 may be in a distal portion of the trapping region 20 (e.g., by virtue of the fact that the particle 80 is often generated in correspondence to the dicing portion lines 92 generated by cracking the external region 90. As can be seen in FIG. 1a, the particle 80 is supported in correspondence to the proximal aperture portion 30 and is sustained by the first couple of borders 36. As shown in FIG. 3b, the particle 80 is moving towards the proximal direction, i.e., abandoning the first trapping aperture portion 32 and moving towards the second trapping aperture portion 34, which is wider than the first trapping aperture portion 32. The particle 80 is still sustained by the first couple of borders 36 and cannot enter yet onto the tracking chamber 40. When the particle 80 arrives in correspondence of the second aperture region 34, the particle 80 can go (e.g., fall, by gravity) into the trapping chamber 40. Subsequently, as shown in FIG. 3d, the particle 80 can be moved (e.g., by any possible occasional movement) in any of the positions indicated with 80a, 80b, 80c and 80d. However, only if the particle 80 reaches one of the positions under the second trapping aperture portion 34 can get out of the trapping chamber 40 (and also only in the presence of a force acting onto that direction), thereby obtaining the piggybank effect.

Inside the trapping chamber 40 there is in general not only one single particle, but there is a multiplicity of particles trapped therein (i.e., all that are stored internally, ideally up to the complete replenishment of the inner chamber). However, the dimensions of the inner trapping chamber 40 (in particular in the planar directions) may be extremely elevated, both in respect to the dimensions of the particle 80 and in respect to the surficial extension of the trapping aperture(s) 30. Basically, the planar area occupied by the trapping chamber 40 (e.g., measured on the floor 40b) may be at least twice as much as (or at least 50% bigger than) the total area of the trapping aperture 30 communicating with the same chamber 40. It is noted that the extension of the trapping chamber 40 in the planar directions is not limited to correspond to the lateral extension of three trapping aperture(s) 30. For example, the extension of the trapping chamber 40 can be elongated, for example, in the distal/proximal direction (e.g., in the proximal direction by extending the trapping chamber 40 further in the active region; in the distal direction by extending the trapping chamber 40 further in the external area 90; and in the lateral or peripheral direction by increasing the number of trapping aperture(s) 30 on the trapping chamber 40).

It is now explained a way according to which the spherical powder particle 80 may autonomously move towards the first trapping aperture portion 32 towards the second trapping aperture portion 34 even in a total or partial absence of other biasing forces (e.g., by only or at least predominantly relying on gravity, in particular when the top face 10a of the semiconductor device 1 is over the bottom face 10b, and/or the thickness direction and the vertical direction coincide). This case is shown in FIG. 3a, which shows the barycenter (center of mass) 80c of the particle 80. FIG. 3a also shows two supporting points 80b at which the particle 80 contacts with the first couple of borders 36 (two examples of supporting points 80b are shown in FIG. 1c, and are placed in the vertically higher part of the first couple of borders 36). (In the view of FIG. 3a, points 80b and 80c would actually covered by the higher surface of the particle 80, but their positions is actually that shown in the figure). As can be seen from FIG. 3a, the barycenter 80c is not in line with the supporting points 80b, but is more advanced in the direction of the increased wideness of the trapping aperture 30 (in this case, in the proximal direction). Hence, an angular momentum is generated, which tends to roll the particle 80 along the first couple of borders 36 (and in particular towards the direction of the increased wideness of the trapping aperture 30, which in this case is the proximal direction, e.g. by virtue of the borders 36 being more and more distant when moving towards the proximal parts of the semiconductor device 1). The angular momentum continues also in FIG. 3b to exert the rolling effect, and the particle 80 arrives to the point that it falls into the trapping chamber 40 through the second, broader, aperture portion 34 (in FIG. 3c). By virtue of these intelligent combinations of features, it is therefore possible to let the particle 80 to autonomously tend to arrive towards the second trapping aperture portion 34 and to fail in the internal trapping chamber 40. It has been understood that, accordingly, it is even not necessary to carry out a particular, specific movement to invite the particles to move, since virtually any movement can initiate the movement of the particles (in particular when the top face 10a is over the bottom face 10b, so as to encourage the movement for gravity). Once the movement is initiated in the direction from the first, narrower, aperture portion 32 towards the second, broader aperture portion 34, the particle 80 will be subjected to the angular momentum, which tends to autonomously make the particle 80 roll towards the second trapping aperture portion 34. It has been understood that even a minimum movement can permit to start the movement of the particle 80 without too many complications. In some cases, a little inclination of the semiconductor device 1 or even a little vibration may permit to initiate the motion of the particle 80.

An additional advantage is obtained by the presence of the second couple of borders 38, which is more extended, in the planar directions (e.g., when seen from above), than the first couple of borders 36. The presence of the second couple of borders 38, which are vertically above the first, narrower, couple of borders 36, permits to maintain in position the particle 80 in case of forces acting in the lateral or peripheral direction. Therefore, if in FIG. 3b (e.g., by virtue of external forces, or because of some irregularities of its shape) the particle 80 is accidentally biased towards right or left, the contact against one of the borders 38 will cause the particle 80 to tend to remain in its position, and possibly to bounce back in the intended position (so that the particle 80 remains sustained by the two borders 36). Notwithstanding, the second couple of borders 38 are optional. On the other side, it is also possible to have more than two couples of borders, e.g., even more vertically elevated with respect to the first and the second couples of borders 36 and 38 (and also broader than the extensions generated by the borders 36 and 38), in such a way that the even better positioning effect is obtained.

It is now explained a method 400 for manufacturing a plurality of semiconductor devices, e.g., like those discussed above. Since in some cases the method 400 permits to obtain a semiconductor device 1 as one of the above, at least some of the features of the semiconductor device 1 as discussed above can complement, in some examples, the features discussed for the present method, and features used for describing the method 400 can be used, totally or partially, to complement features of the semiconductor device 1 as above.

Figure 4:
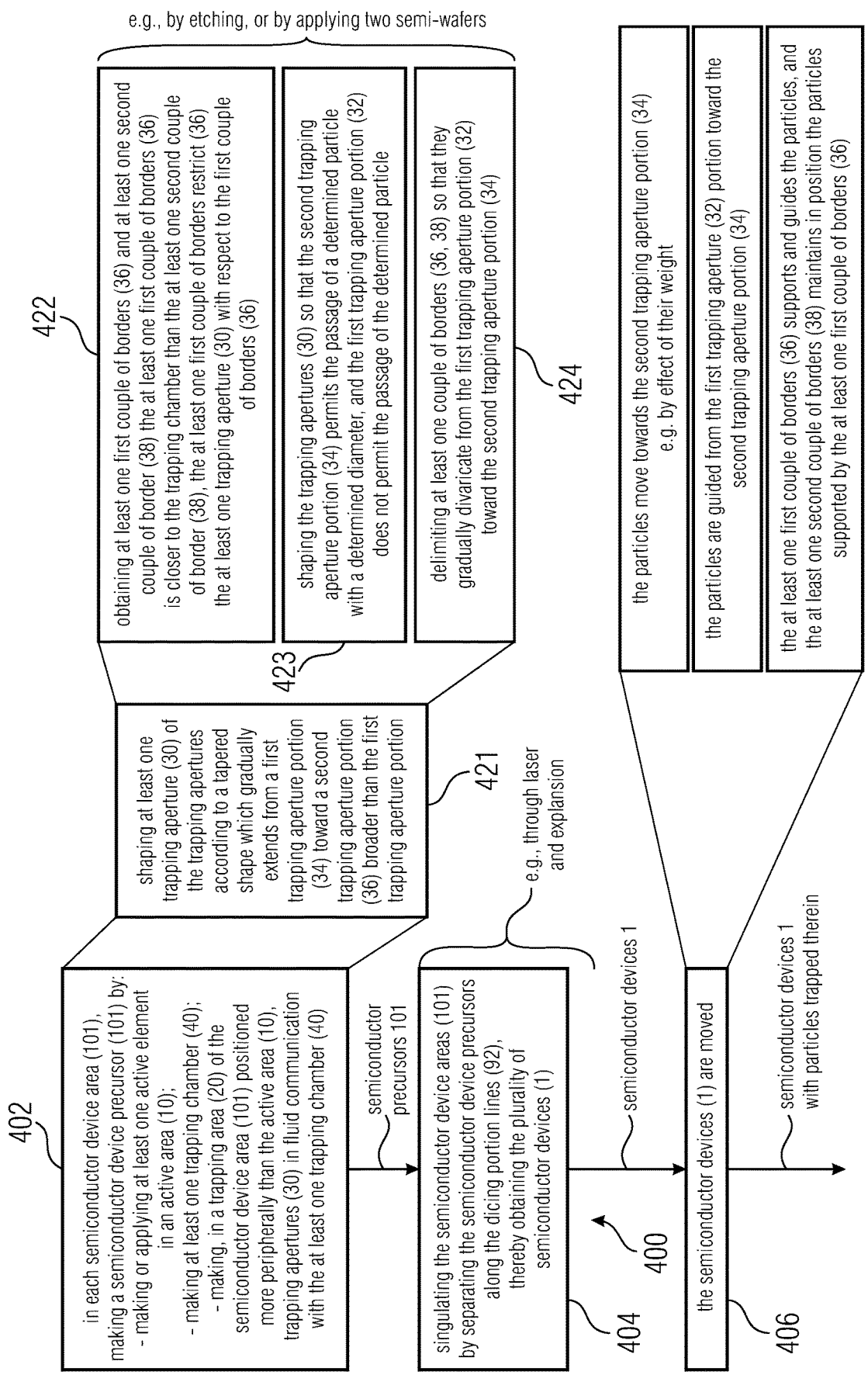
FIG. 4 shows a schematization of a method according to an embodiment of the invention.

FIG. 4 shows an example of the method 400, which may result in manufacturing the semiconductor device 1. The method 400 may include the step 402 and, subsequently, the step 404.

Figure 2A:
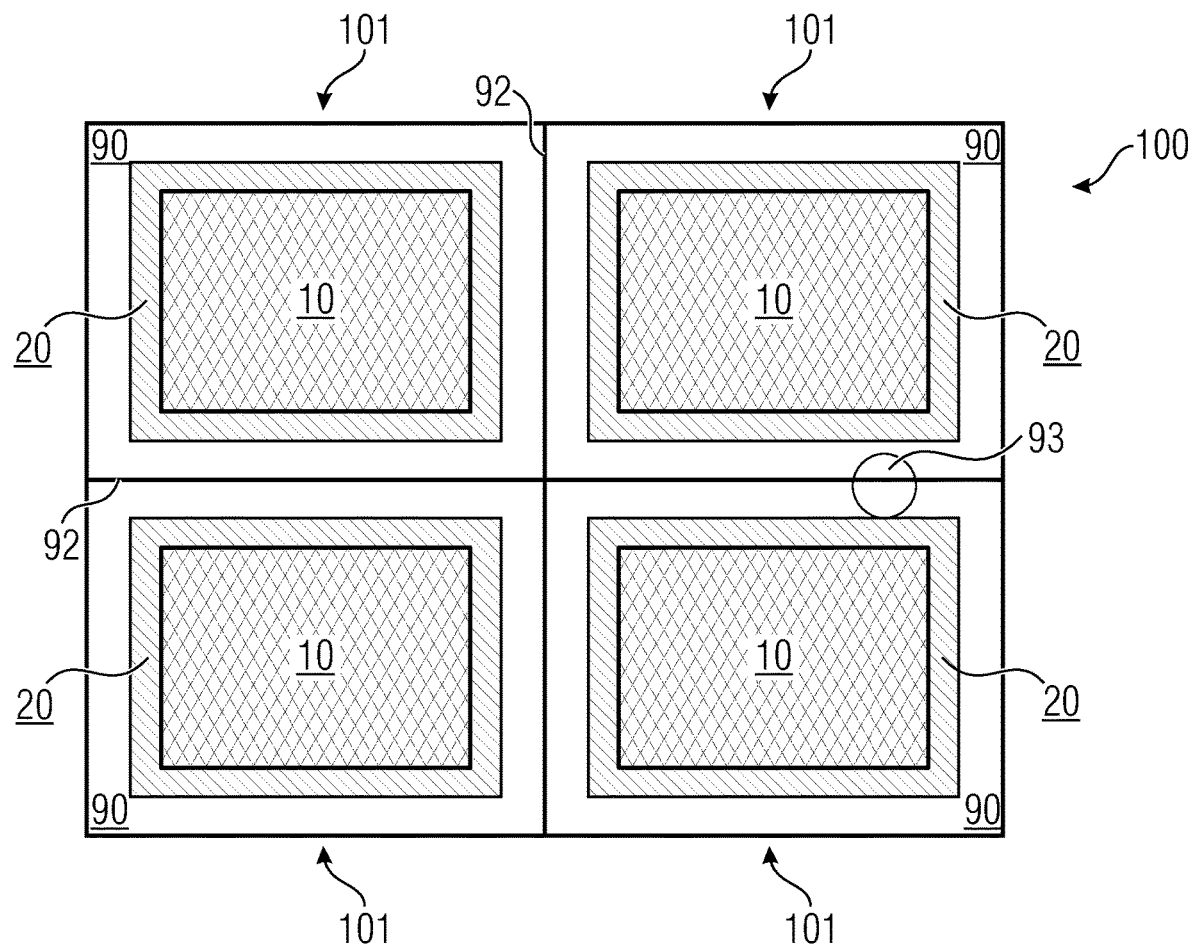
FIG. 2a show a planar view of a semiconductor wafer according to an example.
Figure 2B:
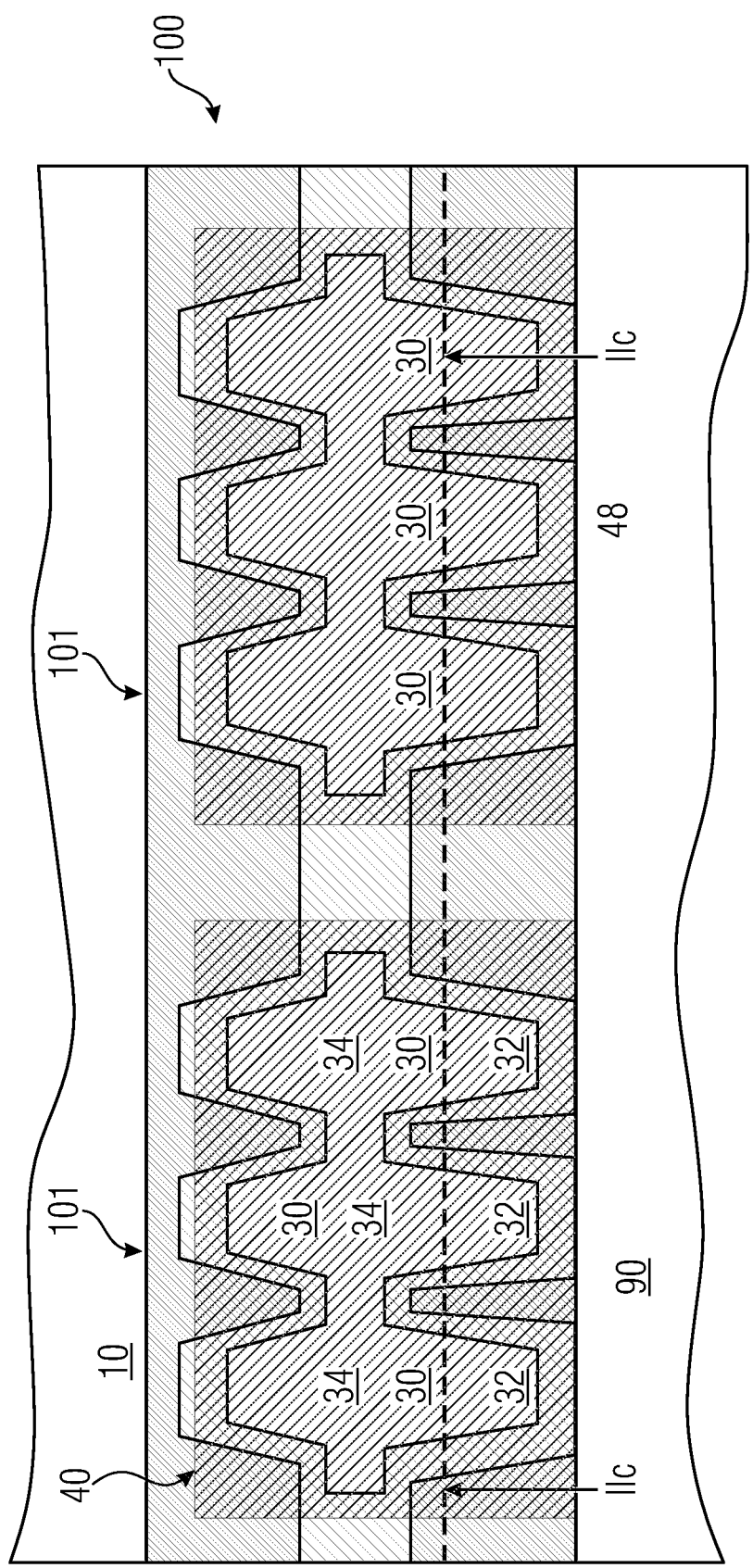
Figure 2C:
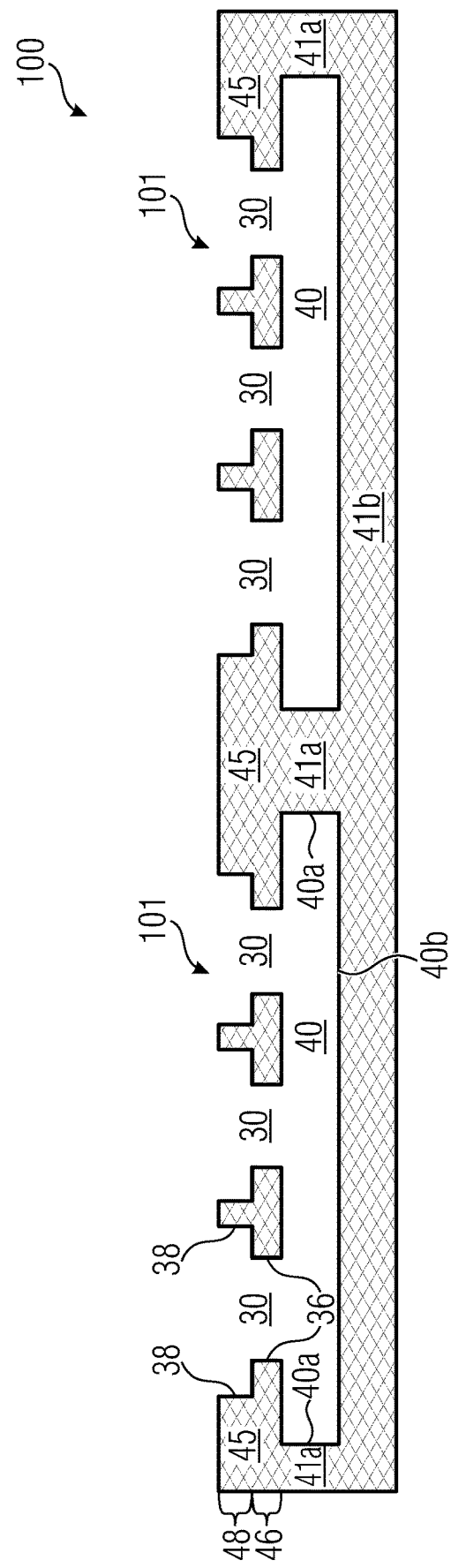
FIG. 2c shows a view of the semiconductor wafer of FIGS. 1a and 1b along a sectional line shown in FIG. 2b.

FIGS. 2a, 2b, and 2c also refer to the method of obtaining the semiconductor device 1 and merely correspond to FIGS. 1a, 1b, and 1c, respectively (and the same reference numerals are used, and their explanations is not repeated). As can be seen from step 402, the method 400 may start from a semiconductor wafer 100 (FIGS. 2a-2c) having a plurality of semiconductor device regions 101 (see FIG. 2a). The wafer 100 is mostly elongated along the planar directions. The different semiconductor device regions 101 (which e.g. mostly extend in the planar directions) are to be singulated along dicing portion lines 92 (see FIG. 2a), e.g., through a laser cone 93 (FIG. 2a). The dicing portion lines 92 may correspond to the borders 92 (sides 92a', 92a", 92e', 92e") of the semiconductor device 1 in FIGS. 1a and 1b, and are therefore indicated with the same number. More in general, each semiconductor device region 101 is meant at being the seat of a semiconductor device 1. As can be seen in FIG. 2a, each semiconductor device region 101 may include an active region 10 (or a precursor thereof), a trapping region 20 (or a precursor thereof) and an external region 90 (or a precursor thereof), which may be in the same positional relationships as the regions 10, 20, 90 discussed above. In general terms, the wafer 100 may be obtained from a semiconductor element, e.g., polysilicon or another non-active semiconductor material. The wafer 100 may initially be, for example, a massive block or semiconductor, non-doped material (non-active), and the delimitation between the regions 10, 20, and 90 (as well as the delimitations between the different semiconductor device regions 101) may initially only be a matter of position, without possibility of distinguishing the different areas on the wafer 100.

However, at step 402, it is possible to make each semiconductor device region 101 to become a semiconductor device precursor by making or applying at least one active element in the active region 10. For example, portions of the active regions may be doped (e.g., by doping some regions with P-dopants, or with N-dopants). There may be any kind of conductive materials (e.g., for making a conductive line), there may be made vias, there may be multiple conductive and/or non-conductive layers. In general, almost any possible semiconductor device 1 may be made (including MEMS devices, sensors, transistors, phototransistors, photodiodes, capacitors, microphones and other pressure sensors).

In the same step 402, it is also possible to make the at least one trapping chamber 40. The at least one trapping chamber 40 may be in some examples only in the trapping region 20, but in some other examples, at least one trapping chamber 40 can also extend through portions (e.g., unused portions) of the active region 10. It is only necessary that at least partially the trapping chamber 40 is in the peripheral trapping region 20, for permitting the particles (mostly generated in correspondence of the dicing portion lines 92) to arrive without passing on the active region 10. It is also possible to make, in state 402, trapping aperture 30 which permit the fluid communication between the external environment and the at least one trapping chamber 40.

The operations on the active region 10 (e.g., making or applying at least one active element in the active region 10), in the at least one trapping chamber 40 (i.e., to physically make the trapping chamber 40) and those regarding the trapping aperture 30 are not necessarily bound to a particular order with respect to each other. In some cases, the aperture portions 30 are made before the trapping chamber 40 and/or the active region 10; in some other cases, the active region 10 is made before the trapping chamber 30 and/or the trapping chamber 40, and so on. In some cases, different operations for making the trapping chamber 40, the active region 10, and the aperture(s) 30 may be performed simultaneously or at least in parallel. In some cases, the same technology for making the active region 10 may also be used for making the apparatus 30 and/or the trapping chambers 40.

In particular, it is possible to shape at least one trapping aperture 30 of the trapping aperture(s) according to a tapered shape which gradually extends from a first trapping aperture portion 34 toward a second trapping aperture portion 36 broader than the first trapping aperture portion 32. As explained above, it is possible to obtain at least one first couple of borders 36 and at least one second couple of border 38 the at least one first couple of borders 36 is closer (e.g., in the thickness direction) to the trapping chamber 40 than the at least one second couple of border 38, the at least one first couple of borders restrict 36 the at least one trapping aperture 30 with respect to the first couple of borders 36 in step 422. In some cases, it is possible to shape the trapping aperture(s) 30 by shaping them so that the second trapping aperture portion 34 permits the passage of a determined particle with a determined diameter, and the first trapping aperture portion 32 does not permit the passage of the determined particle (step 423). In step 424, it is possible to delimit at least one couple of borders 36, 38 so that they gradually divaricate from the first trapping aperture portion 32 toward the second trapping aperture portion 34. In this way, it is possible to obtain the semiconductor precursors 101. The semiconductor precursors 101 may be exactly the same of the semiconductor devices 1 to be manufactured, with the difference that they are still integral with each other by virtue of the fact that the singulation has not been carried out yet.

As explained above, it is possible that the wafer 100 is at least initially one single, massive block of semiconductor material (at least in correspondence of the regions 20 and 90 or the precursors thereof, but in some examples also in correspondence of the precursor of the area 10). Hence, it is possible to make the precursors 101 of the semiconductor device 1 follows.

The wafer 100 is initially massive and does not present any of the apparatus 30 in any of the trapping chambers 40. Initially, it is possible to etch the wafer 100 in correspondence of the surfaces which have to be removed for making the trapping aperture(s) 30, e.g. by etching from above towards below (along the thickness direction). In the case of having two couples of borders 36 and 38, then a first etching operation may be performed on the wider area for which the second couple of borders 38 extends. Subsequently, a second etching operation may be performed in the narrower area for which the borders 36 extend. However, in this case, the etching may not only interest the sublayer 46, but may also interest the whole height of the trapping chamber 40, up to the floor 40b. At this point, an internal etching (e.g., performed along the planar directions) up to the lateral walls 40a, the proximal wall 40d, and the distal wall 40e can be performed. Accordingly, the trapping chamber 40 may be obtained.

In other examples, it is possible, instead of using an internal etching, to manufacture the wafer 100 from two distinct semi-wafers. For example, the superior layer 45 may be manufactured in a first semi-wafer, while the floor layer 41b may be made in a second, different semi-wafer. The lateral layers 41a, may be either made in the semi-wafer 41b or in semi-wafer having the floor layer 41b or in the semi-wafer having the ceiling layer 45. In this case, the two semi-wafers may be glued or otherwise made adhered to each other, thereby generating the chamber 40 as an effect of the distance created by the lateral layers 41a. in some cases, the trapping aperture(s) 30 may be already prepared in the semi-wafer having the ceiling layer 45 or, in alternative, they may be subsequently etched.

In other cases, the ceiling layer 45 may be obtained as a cantilevered layer, the lateral layers 41a being the elements that sustain the cantilevered element instantiated by the ceiling layer 45 (or the cantilevered layer here could be the floor layer 41b in other examples).

Other examples may include the use of springs for one suspended layer (e.g., by suspending the ceiling layer 45 or the floor layer 41b).

Any other known method can actually be implemented to obtain the at least one trapping chamber 40 and the trapping aperture(s) 30.

In examples, the method 400 may include a step 404 of singulating the semiconductor device areas 101 by separating the semiconductor device precursors 101 along the dicing portion lines 92. Accordingly, the plurality of semiconductor devices 1, each singulated from the other ones, may be obtained. In some examples, if the step 404 of singulating generates cracks and/or discontinuities elements which easily cause the generation of powders, step 404 may include a step of spacing the semiconductor devices 1, or the precursors (101) thereof, while the semiconductor devices 1, or the precursors (101) thereof, are positioned in such a way that the top face 10a is over (e.g., in the thickness direction) the bottom face 10b, and/or the planar directions of the semiconductor devices 1, or the precursors (101) thereof, are substantially horizontal. At least, it may be provided that the trapping aperture(s) 30 are vertically over the respective trapping chamber (40), so as to increase the probability of powder to initiate the movement (ideally rolling movement) along the borders 36 as described by the sequence of FIGS. 3a-3c.

There are now explained some techniques for singulating the semiconductor portions along the dicing portion lines 92. At first, in some examples the wafer 100 may be made to adhere (e.g., positioned with the top face 10a vertically over the bottom face 10b) to an adhesive layer, which extends in the planar directions. For example, bottom face 10b of each semiconductor precursor 101 may be caused to adhere to the adhesive layer, which is external and is not shown. In order to singulate the semiconductor regions 101 (precursors), a laser beam (cone) may be applied along the dicing portion lines 92 in the semiconductor wafer 100. In some examples, laser stealth dicing (or other laser techniques) may be performed. The laser beam may cause cracks along the dicing portion lines 92. Accordingly, the precursors of the semiconductor devices 1 have some breaking lines in correspondence to lines 92; notwithstanding they are still patched with each other. in order to separate (i.e., generating a distance different from zero) between the different precursors, the adhesive layer may be caused to expand (e.g., by applying some forces which tend to extend it along a planar directions). This causes an increase of the distance between the borders 92 of the different semiconductor devices 1 (which at this point are independent devices). Preferentially, this expansion is performed when the top face 10a is vertically over (in the vertical direction) the bottom face 10b, and in particular when the bottom face 10b and the top face 10a are positioned substantially horizontally.

The fact that the most external region 90 is bulk and/or massive permits to simplify the operations of cutting, because the presence of powder (or imperfections like candle sticks) would be increased if the precursors 101 of the semiconductor device 1 were singulated directly in correspondence of the trapping region 20, because of the presence of the holes (chambers 40, aperture(s) 30, etc.) which would increase the generation of powder or other imperfections (e.g., candle sticks) which cause the undetermined generation of powder.

It is noted that powder generated with the process of cracking the wafer and subsequently made to expand through the expansion of the adhesive layer may cause a degeneration of powder particles. However, these particles can be trapped in the trapping region by moving (as explained above) through the aperture region and falling into the trapping chambers 40.

The present technique is so advantageous that it is not even necessary (despite also possible) to carry out a subsequent step of shaking or ventilating the semiconductor devices. This is because it is simply possible to obtain the intended effect of trapping the powder particle simply by moving the semiconductor devices 1. Accordingly, the great majority of the particles do not fall onto the active region 10 which, therefore, maintains high performances that would be impaired by the presence of the powder there onto. Step 406 of FIG. 4 shows that subsequently, at 406, the semiconductor devices (1) are moved, e.g. through manipulating robots, for other, normal operations. During these passages and/or subsequently, the particles may move towards the second trapping aperture portion 34 e.g., by effect of their weight; the particles are guided from the first trapping aperture 32 portion toward the second trapping aperture portion 34; and the at least one first couple of borders 36 supports and guides the particles, and the at least one second couple of borders 38 maintains in position the particles supported by the at least one first couple of borders 36.

The inventors have noted that the most dangerous particles have diameter between 1 μm (micrometer) and 5 μm (micrometers). Therefore, in examples, it is preferable to define the dimensions of the trapping aperture(s) 30 so that, at least in correspondence of the second trapping aperture portion 34, a spherical particle of diameter of 5 μm (micrometers) can pass through a trapping aperture 30. Notably, the passage of the spherical particle of diameter of 5 μm (micrometers) may be possible also by virtue of the presence of the lateral trapping portions 34a and/or of the third trapping portion 35 of the trapping aperture 30. Accordingly, while the segment 32e' between the borders 36 of the trapping aperture 30 (FIG. 1b) may be less than 5 μm (micrometers), a spherical particle can notwithstanding pass through the second trapping aperture portion 34 at least by virtue of the lateral trapping portions 34a and/or of the third trapping portion 35, which cause the second trapping aperture portion 34 to be substantially borderless in its most proximal part. In order to trap particles with diameter of 1 μm (micrometer), at least the first trapping aperture portion 32 shall permit the passage of a spherical particle of diameter of 1 μm. For examples, the segment 32e' measured at the most distal edge of the trapping aperture 30 (FIG. 1b) may be at least 1 μm (micrometer), or at least 0.8 μm (micrometers).

The semiconductor device 1 may have a planar extension (in the planar directions) which in some examples may be between 0.5 mm² and 1000 mm², e.g. in particular between 200 mm2 and 600 mm2 (square millimeters), e.g. 20 mm×20 mm (e.g. 20 mm in the first planar direction of FIG. 1a and 20 mm in the second planar direction), encompassing both the active region 10, the trapping region 20, and the most external region 90. The extension, along the distal/proximal direction, of the most external region 90 may be between 20 μm (micrometers) and 100 μm (micrometers), and may be 50 μm (micrometers). This dimension may be constrained by the dimensions of the laser beam, e.g. in the examples in which the semiconductor device 1 is obtained through laser cracking: since the laser beam has a diameter which may be between 20 μm (micrometers) and 200 μm (micrometers) and may be 100 μm (micrometers), the most external region 90 may have the extension of the half of the diameter of the laser beam. The extension, along the distal/proximal direction, of the trapping region 20, may be between 20 and 80 μm (micrometers), and may be, for example, 30 μm or 35 μm (micrometers). It has been noted that these measurements can be considered optimal, in particular (but not uniquely) in the case of the laser cracking.

It is noted that in other examples different shapes and numbers of trapping aperture(s) 30 may be implemented. For example, there may be one single trapping aperture 30 communicating with each trapping chamber 40, or two, or three, or four, or even more trapping apertures 30 communicating with each trapping chamber 40. While multiple trapping apertures 30 are shown displaced in one row along the lateral direction, it is also possible to partially displace them according to different ordering. For example, there may be two parallel rows or lines of trapping apertures 30, or different arrangements along the first and second planar directions.

What is claimed is:

1. A semiconductor device comprising:
    an active region; and
    a trapping region positioned peripherally with respect to the active region,
    wherein the trapping region completely surrounds the active region in top view,
    wherein the trapping region comprises at least one trapping aperture configured for permitting passage of particles, and
    wherein the at least one trapping aperture is in communication with at least one trapping chamber configured for trapping the particles.

2. The semiconductor device of claim 1, wherein the at least one trapping aperture has a tapered shape gradually extending from a first trapping aperture portion toward a second trapping aperture portion broader than the first trapping aperture portion.

3. The semiconductor device of claim 2, wherein the at least one trapping aperture is delimited by at least one couple of borders gradually divaricating from the first trapping aperture portion toward the second trapping aperture portion so as to guide a particle from the first trapping aperture portion toward the second trapping aperture portion.

4. The semiconductor device of claim 3, wherein the at least one couple of borders includes at least one first couple of borders and at least one second couple of borders, wherein the at least one first couple of borders is closer to the at least one trapping chamber than the at least one second couple of borders, and wherein the at least one first couple of borders restricts the at least one trapping aperture with respect to the second couple of borders.

5. The semiconductor device of claim 2, wherein the at least one trapping aperture is shaped so that the second trapping aperture portion is configured for permitting the passage of a determined particle having a determined diameter, and the first trapping aperture portion is configured for not permitting the passage of the determined particle.

6. The semiconductor device of claim 5, wherein each trapping aperture is configured for not permitting passage of two spherical particles, one tangent to the other, each having the determined diameter.

7. The semiconductor device of claim 2, wherein the first trapping aperture portion is more distal from the active region than the second trapping aperture portion.

8. A semiconductor device comprising:
    an active region; and
    a trapping region positioned peripherally with respect to the active region,
    wherein the trapping region comprises at least one trapping aperture configured for permitting passage of particles,
    wherein the at least one trapping aperture is in communication with at least one trapping chamber configured for trapping the particles,
    wherein the trapping chamber is a walled chamber except for the at least one trapping aperture,
    wherein the at least one trapping aperture has a tapered shape gradually extending from a first trapping aperture portion toward a second trapping aperture portion broader than the first trapping aperture portion, and
    wherein the at least one trapping aperture is shaped so that the second trapping aperture portion is configured for permitting the passage of a particle having a determined diameter, and the first trapping aperture portion is configured for not permitting the passage of the particle.

9. The semiconductor device of claim 8, wherein the at least one trapping aperture is delimited by at least one couple of borders gradually divaricating from the first trapping aperture portion toward the second trapping aperture portion so as to guide the particle from the first trapping aperture portion toward the second trapping aperture portion.

10. The semiconductor device of claim 9, wherein the at least one couple of borders includes at least one first couple of borders and at least one second couple of borders, wherein the at least one first couple of borders is closer to the at least one trapping chamber than the at least one second couple of borders, and wherein the at least one first couple of borders restricts the at least one trapping aperture with respect to the second couple of borders.

11. The semiconductor device of claim 8, wherein each trapping aperture is configured for not permitting passage of two spherical particles, one tangent to the other, each having the determined diameter.

12. The semiconductor device of claim 8, wherein the first trapping aperture portion is more distal from the active region than the second trapping aperture portion.

13. A semiconductor device comprising:
an active region; and
a trapping region positioned peripherally with respect to the active region,
wherein the trapping region comprises at least one trapping aperture configured for permitting passage of particles,
wherein the at least one trapping aperture is in communication with at least one trapping chamber configured for trapping the particles,
wherein the at least one trapping aperture has a first tapered shape gradually extending from a first trapping aperture portion toward a second trapping aperture portion broader than the first trapping aperture portion,
wherein the at least one trapping aperture has a second tapered shape gradually narrowing from the second trapping aperture portion toward a third trapping aperture portion narrower than the second trapping aperture portion, and
wherein the second tapered shape mirrors the first tapered shape.

14. The semiconductor device of claim 13, wherein the at least one trapping aperture is delimited by at least one couple of borders gradually divaricating from the first trapping aperture portion toward the second trapping aperture portion and gradually divaricating from the third trapping aperture portion to the second trapping aperture portion so as to guide a particle from the first or third trapping aperture portion toward the second trapping aperture portion.

15. The semiconductor device of claim 13, wherein the first trapping aperture portion and the third trapping aperture portion have the same size in top view.

16. The semiconductor device of claim 13, wherein the trapping region completely surrounds the active region in top view.

17. The semiconductor device of claim 13, wherein the second trapping aperture portion is configured for permitting the passage of a determined particle having a determined diameter, and the first and third trapping aperture portions are configured for not permitting the passage of the determined particle.

18. The semiconductor device of claim 13, wherein the trapping chamber is a walled chamber except for the at least one trapping aperture.

19. A semiconductor device comprising:
an active region; and
a trapping region positioned peripherally with respect to the active region,
wherein the trapping region comprises at least one trapping aperture configured for permitting passage of particles,
wherein the at least one trapping aperture is in communication with at least one trapping chamber configured for trapping the particles,
wherein the trapping chamber is a walled chamber except for the at least one trapping aperture,
wherein the at least one trapping aperture has a tapered shape gradually extending from a first trapping aperture portion toward a second trapping aperture portion broader than the first trapping aperture portion,
wherein the at least one trapping aperture is delimited by a couple of borders including at least one first couple of borders and at least one second couple of borders,
wherein the at least one first couple of borders is closer to the at least one trapping chamber than the at least one second couple of borders, and
wherein the at least one first couple of borders restrict the at least one trapping aperture with respect to the at least one second couple of borders.

20. The semiconductor device of claim 19, wherein the couple of borders gradually divaricate from the first trapping aperture portion toward the second trapping aperture portion so as to guide a particle from the first trapping aperture portion toward the second trapping aperture portion.

* * * * *